United States Patent
Mori et al.

(10) Patent No.: US 6,751,153 B2
(45) Date of Patent: Jun. 15, 2004

(54) NON-VOLATILE SEMICONDUCTOR MEMORY DEVICE AND INFORMATION APPARATUS

(75) Inventors: Yasumichi Mori, Ikoma (JP); Ken Sumitani, Tenri (JP); Yuji Tanaka, Nara (JP); Haruyasu Fukui, Yoshino-gun (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/187,048

(22) Filed: Jun. 28, 2002

(65) Prior Publication Data

US 2003/0016573 A1 Jan. 23, 2003

(30) Foreign Application Priority Data

Jun. 28, 2001 (JP) ........................................ 2001-197535

(51) Int. Cl.$^7$ ................................................. G11C 8/00
(52) U.S. Cl. .............................. 365/230.06; 365/185.11; 365/230.08
(58) Field of Search ....................... 365/185.11, 185.33, 365/189.04, 230.03, 230.06, 230.08

(56) References Cited

U.S. PATENT DOCUMENTS

| | | | |
|---|---|---|---|
| 5,245,572 A | 9/1993 | Kosonocky et al. | 365/189.02 |
| 5,793,676 A * | 8/1998 | Bedarida et al. | 365/185.12 |
| 5,943,283 A | 8/1999 | Wong et al. | 365/230.01 |
| 5,995,415 A | 11/1999 | Kuo et al. | 365/185.11 |
| 6,088,264 A * | 7/2000 | Hazen et al. | 365/185.11 |
| 6,125,055 A | 9/2000 | Kasa et al. | 365/185.04 |
| 6,401,164 B1 * | 6/2002 | Bartoli et al. | 711/103 |

FOREIGN PATENT DOCUMENTS

| | | |
|---|---|---|
| EP | 0745995 | 12/1996 |
| EP | 0905704 | 3/1999 |

* cited by examiner

Primary Examiner—Son Mai
(74) Attorney, Agent, or Firm—Morrison & Foerster LLP

(57) ABSTRACT

A non-volatile semiconductor memory device, comprises a plurality of memory banks each including a plurality of memory cells, a command recognition section for identifying an externally input command signal and outputting an identification signal, an internal control section for generating a control signal for executing a command designated by the identification signal, an address control section for generating an internal address signal to a memory region including an arbitrary combination of the plurality of memory banks to be accessed, based on the externally input address signal, and a first address inversion section for inverting or non-inverting the logical values of at least a specific bit of the input address signal and outputting the resultant input address signal to the address control section. Predetermined memory cells are accessed based on the control signal and the internal address signal.

16 Claims, 14 Drawing Sheets

*Only upper two bits of each address are shown

"RELATED ART"

"RELATED ART"

"RELATED ART"

"RELATED ART"

FIG. 13 "RELATED ART"

"RELATED ART"

FIG.15 "RELATED ART"

NON-VOLATILE SEMICONDUCTOR MEMORY DEVICE AND INFORMATION APPARATUS

BACKGROUND OF THE INVENTION

1. Field of the Invention

The present invention relates to an electrically writable/erasable non-volatile semiconductor memory device, and an information apparatus using the same. More particularly, the present invention relates to a non-volatile semiconductor memory device which electrically executes data read, write and erase operations separately, such as flash EEPROM (flash memory), and the like, and an information apparatus using the same.

2. Description of the Related Art

In conventional electrically writable/erasable flash memories, the electrode voltage of each selected transistor in memory cells subjected to a data write/erase operation is in a write/erase mode in which the voltage is suited to the write/erase operation. In memory cells subjected to an electrical read operation, the electrode voltage of each transistor in selected memory cells is in a read mode in which the voltage is suited to the read operation.

Typically, the write/erase mode and the read mode have to have a different applied electrode voltage. Therefore, it is difficult to allow memory cells in the write/erase mode and memory cells in the read mode to coexist in the same memory block. For this reason, dual work flash memories have been widely developed and used.

The dual work flash memory comprises a plurality of memory banks including some memory blocks. While one of a plurality of memory banks is subjected to a write/erase operation, a read operation is carried out for another memory bank, thereby achieving a so-called dual work operation.

In the dual work flash memory, the memory bank of the write/erase operation and the other memory bank of the read operation have to be controlled by separate address signals.

This is because an address signal input for the read operation has to avoid affecting the write/erase operation executed in the other memory bank. Therefore, the dual work flash memory has to have address signals on at least two lines (at least two sets of address signals).

An example of the address control of the dual work flash memory will be described with reference to FIG. 9 which shows major portions of the dual work flash memory.

In FIG. 9, the dual work flash memory has input buffer 21, an address control circuit 22, a command recognition section 23, a write/erase control circuit 24, two memory banks a and b, a decoder circuit 25 connected to memory bank a, and a decoder circuit 26 connected to memory bank b.

An address signal A is input to the input buffer 21 from an external address pad (not shown).

An address signal Abuf is input to the address control circuit 22 from the input buffer 21.

A command signal C is input to the command recognition section 23. When the command recognition section 23 recognizes the signal as a valid command, the command recognition section 23 outputs a latch control signal Clatch to the address control circuit 22, and a control signal Cwsm identifying the type of the command from the command recognition section 23 to the write/erase control circuit 24.

To the write/erase control circuit 24, a bank signal Cbank1 described below is input from the address control circuit 22, and the control signal Cwsm is input from the command recognition section 23. The write/erase control circuit 24 outputs write/erase control signals Ca and Cb.

To the decoder circuit 25, an address signal Aa is input from the address control circuit 22, and the write/erase control signal Ca is input from the write/erase control circuit 24.

To the decoder circuit 26, an address signal Ab is input from the address control circuit 22, and the write/erase control signal Cb is input from the write/erase control circuit 24.

Hereinafter, the address control circuit 22 which outputs the address signals Aa and Ab which correspond to the above-described address signal on two lines will be described in detail with reference to FIG. 10.

As shown in FIG. 10, the address control circuit 22 has an address latch circuit 31 controlled by the latch control signal Clatch, a bank decoder 32 which decodes the received address signal Abuf so as to indicate which memory bank an address is directed to, a latch circuit 33 which is controlled by the latch control signal Clatch and stores a bank signal Cbank decoded by the bank decoder 32, and a multiplexer circuit 34 which is controlled by the bank signal Cbank1 stored by the latch circuit 33 and performs connection control so that an address signal Alatch latched by the address latch circuit 31 and the address signal Abuf correspond to the address signals Aa and Ab on the two lines. The bank signal Cbank1 is also output to the write/erase control circuit 24.

It should be noted that general flash memories further include a data signal carrying information to be written, a sense circuit for reading information stored in memory cells, various circuits for high voltage (hereinafter also referred to as a high-voltage-related circuit), such as a booster circuit and the like. These are not specifically involved in the present invention and therefore are not shown. The structure and operation of such elements are not described unless particularly required.

Hereinafter, for example, a description is given of address control when data is read from memory bank b while data is written to memory bank a.

When the dual work flash memory is instructed to write data to memory bank a, the command signal C represents a command of a write operation, and the address signal A represents an address in memory bank a.

The command signal C is recognized (identified) by the command recognition section 23 as a write command, and activates the latch control signal Clatch. Further, control signal Cwsm informs the write/erase control circuit 24 that the input command is a write command.

On the other hand, the input buffer 21 receives the address signal A and transfers the address signal Abuf to the address control circuit 22. The address control circuit 22 receives the activated latch control signal Clatch from the command recognition section 23, and causes the address signal Abuf to be stored in the address latch circuit 31.

Further, the bank decoder 32 decodes the input address signal Abuf so as to indicate which bank the address represented by the input address signal Abuf is directed to (i.e., whether the address is in memory bank a or memory bank b). Assuming that memory banks a and b have the same memory capacity (the size of address space), and a memory map as shown in FIG. 11, the address signal Abuf designates memory bank a when the most significant bit of the address is "0", while the address signal Abuf designates memory bank b when the most significant bit of the address is "1".

The bank signal Cbank decoded by the bank decoder 32 is stored in the latch circuit 33 in response to the activation of the latch control signal Clatch.

Further, based on the bank signal Cbank1 stored by the latch circuit 33, the multiplexer circuit 34 performs connection control so that the address signal Alatch stored in the address latch circuit 31 and address signal Abuf correspond to the respective address signals Aa and Ab.

The above-described operations connect signal lines so that the address signal Alatch stored in the address latch circuit 31 corresponds to the address signal Aa directed to memory bank a, while the address signal Abuf output from the input buffer 21 corresponds to the address signal Ab directed to memory bank b.

The write/erase control circuit 24 receives the bank signal Cbank1, activates the write/erase control signal Ca directed to memory bank a, and controls the decoder circuit 25 so that memory cells selected by the address signal Aa in memory bank a are caused to be in the write mode.

The address signal Ab to memory bank b is logically and electrically separated from the address signal Aa to memory bank a by the multiplexer circuit 34 in the address control circuit 22. The address signal Ab is also connected to correspond to the address signal Abuf from the input buffer 21. In this situation, when a request for a read operation which designates an address is externally input, memory cells in memory bank b are arbitrarily selected irrespective of an address selected in memory bank a.

It should be noted that although memory banks a and b have the same size for the sake of simplicity, even when memory banks a and b have a different size, the same function can be achieved by modifying the logic of the bank decoder 32. The same function can also be obtained when a read operation is carried out in memory bank a while a write/erase operation is carried out in memory bank b. In this case, in the multiplexer circuit 34, signal lines are connected so that the address signal Abuf output by the input buffer 21 corresponds to the address signal Aa directed to memory bank a, while the address signal Alatch stored in the address latch circuit 31 correspond to the address signal Ab directed to memory bank b.

Generally, the dual work flash memory is often employed in portable apparatuses in which an area occupied by a memory device is limited. Hereinafter, a representative system example of a portable apparatus using the dual work flash memory will be described with reference to FIG. 12 as to the usage and necessity of the dual work flash memory in the portable apparatus.

As shown in FIG. 12, the system of the portable apparatus has a CPU 51 for controlling the entire portable apparatus, a dual work flash memory 52, a RAM 53, an I/O interface 54 for controlling an I/O apparatus such as a microphone, a liquid crystal display apparatus or the like, and a data bus 55 for connecting communicably and electrically these elements.

The CPU 51 typically executes an executable code (instruction code) stored in the dual work flash memory 52. FIG. 12 is referenced for the purpose of describing an operation of the dual work flash memory, and does not show other devices, control signals, or the like.

For example, an operation in which audio data input from a microphone as an input apparatus is stored in the dual work flash memory 52 will be considered below.

In this case, the CPU 51 has to execute the instruction code so to control the dual work flash memory 52 and the I/O interface 54. Since the code is stored in the dual work flash memory 52 as described above, the CPU 52 has to fetch the code from the dual work flash memory 52 via a path (1) on the data bus 55.

In order to store the audio data to the dual work flash memory 52 via the I/O interface 54, data has to be transferred via a path (2) on the data bus 55.

If a flash memory which does not have a dual work function is employed, the fetch of the code via path (1) cannot be carried out when data obtained via path (2) is being written to the flash memory 52. In other words, the CPU 51 cannot work when data is being written into the flash memory 52. Similarly, the CPU 51 cannot work when data is being erased from the flash memory 52.

Generally, in flash memories, a data write/erase speed is sufficiently slow compared to a data read speed so that an instantaneous response, important to portable apparatuses (information apparatuses), may be impaired. This problem may be solved by storing the instruction code in another flash memory or ROM. However, such a solution is not practical in consideration of the above-described limitation of the occupied area and the level of convenience when the instruction code is stored in the flash memory.

In such a system, use of the dual work flash memory makes it possible to achieve the fetch of codes via path (1) while data (audio data) is being stored via path (2) (write operation). In this case, the data and the codes have to be stored in separate memory banks.

A region in which codes for the CPU 51 are stored and read operations are mainly carried out is herein defined as a code region. A region in which various data is stored and write/erase operations are frequently carried out is herein defined as a data region. These are not the only definitions. As described above, in the forgoing example, the code region and the data region have to correspond to separate memory banks. For example, the code region corresponds to memory bank a, while the data region corresponds to memory bank b, and the like. Assuming that the dual work flash memory has two memory banks a and b having the same memory capacity, the data region and the code region have the same memory capacity.

The memory capacity ratio between the data region and the code region, which is required by the user, varies greatly according to an application in which they are employed. For example, for an application in which large-size data (image data or the like) is handled, the data region is larger. For an application having a number of functions, the code region has to have a large memory capacity. Particularly, the timing of when to determine the memory capacity of the code region is determined depends greatly on the quality or performance of a system program or an application program. Therefore, it is possible that the memory capacity ratio is changed after system hardware is completed.

These various demands are met by preparing a plurality of combinations of memory capacities of switchable memory banks. Assuming a dual work flash memory has a total capacity of 32M bits, there are combinations of 24 M and 8M (memory bank a has a capacity of 24 M while memory bank b has a capacity of 8 M), and 16 M and 16 M, and the like, for example. Some techniques are considered to realize a plurality of combinations on a single chip for the purpose of a reduction in development cost.

In one of such techniques, a decoder is provided on opposite ends of a memory array, and word lines and/or bit lines are separated (cut) at an appropriate position by a hard mask. Specifically, in a process of producing a semiconductor memory device, a wiring pattern is fixedly modified by changing a mask for forming wires. By changing a position which is to be cut using a hard mask, it is possible to divide the memory array into a plurality of regions having various memory capacity ratios (a plurality of memory banks).

With this technique, the same decoder circuits correspond to respective memory bank capacities generated by switching. This leads to an increase in chip area and a difficulty in optimizing an access time and the like. Further, the memory capacities cannot be changed after the completion of the chip, resulting in disadvantages, such as evaluation of the access time cannot be carried out in terms of a memory capacity ratio, the production takes a long time, and the like.

In another technique, a plurality of small-capacity memory banks are prepared, and some of the memory banks are appropriately combined so that the combination seemingly works as a memory bank. FIG. 13 shows an exemplary configuration of a dual work flash memory having four memory banks. For the sake of simple comparison with the above-described example, the capacities of memory banks a2 to d2 are half the capacities of the above-described memory banks a and b, respectively. In this case, the total capacity of memory banks a2 to d2 is the same as the total capacity of memory banks a and b. The components in FIG. 13 are similar to those in FIG. 9 and the description thereof is omitted here. Specifically, an input buffer 61 corresponds to the input buffer 21, a command recognition section 63 corresponds to a command recognition section 23, a write/erase control circuit 64 corresponds to the write/erase control circuit 24, and an address control circuit 62 corresponds to an address control circuit 22.

The address control circuit 62 outputs address signals Aa2 to Ad2 to the corresponding memory banks a2 to d2, which signals are input to decoders 65 to 68.

The write/erase control circuit 64 outputs write/erase control signals Ca2 to Cd2, which are similarly input to the respective decoders 65 to 68.

FIG. 14 is a diagram of a configuration of the address control circuit 62, showing major parts thereof. Except for a multiplexer circuit 74, the other components are similar to those in the address control circuit 22 of FIG. 10. Specifically, an address latch circuit 71 corresponds to the address latch circuit 31, a bank decoder 72 corresponds to the bank decoder 32, and a latch circuit 73 corresponds to a latch circuit 33. In this case, since there are four memory banks a2 to d2, the multiplexer circuit 74 and the bank decoder 72 additionally receives a control signal Cmux, and outputs address signals Aa2 to Ad2 directed to the respective memory banks a2 to d2.

In this configuration, there are three possible combinations of the memory capacities. Specifically, a combination of (a2) and (b2+c2+d2) provides a memory bank configuration having a memory capacity ratio of 1:3 where it is assumed that memory banks b2 to d2 constitute a single memory bank. Similarly, a combination of (a2+b2) and (a2+d2) provides a memory capacity ratio of 2:2 (1:1), and a combination of (a2+b2+c2) and (d2) provides a memory capacity ratio of 3:1. FIG. 15 shows the memory maps of these configurations.

In FIG. 15, it is assumed that an address value ascends in order of memory banks a2→b2→c2→d2. It is necessary that the multiplexer circuit 74 and the bank decoder 72 are informed using the control signal Cmux of which of the above-described three combinations of the memory banks are selected. For example, it is assumed that the 1:3 configuration is selected. The bank decoder 72 decodes an address signal Abuf to find whether the input address is included in memory bank a2 or any of (b2, c2, d2). The multiplexer circuit 74 has to separate Aa2 from (Ab2, Ac2, Ad2) by hardware. In this case, if each of the address signals (Ab2, Ac2, Ad2) is logically connected to the respective memory banks (i.e., the same address signal is transferred), control is made easier.

Operations other than those described above are similar to those in the address control circuit 22 of FIG. 10. The above-described configuration makes it possible to achieve a dual work flash memory which has a memory bank capacity ratio of 1:3, 1:1 and 3:1. It should be noted that if minute settings of the above-described memory capacity ratios are required, the capacity of each memory bank is made small and a larger number of memory banks are used.

To achieve the above-described dual work flash memory having a number of small-capacity memory banks, the number of address signals has to be the same as the number of the memory banks. For example, in the case of the dual work flash memory of FIG. 13 having the four memory banks a2 to d2, the four address signals Aa2 to Ad2 are required. Assuming that the flash memory has a total memory capacity of 32 M bits, the four memory bank a2 to d2 each have a memory capacity of 8 M bits. If access can be executed in units of a byte (8 bits), the bit width of an address corresponding to each memory bank requires at least 20 bits.

In this case, four sets of addresses having a bit width of at least 20 bits are required, and at least 80 address signal lines are provided. If each memory bank capacity is divided into halves and 8 memory banks are provided, 8 sets of addresses having a bit width of at least 19 bits are required, so that at least 152 address signal lines are provided.

Thus, if each memory bank is segmentized, the number of address signals is significantly increased. Further, the size of a high-voltage-related circuit, a sense circuit, a decoder circuit, and the like is increased, so that the proportion of the chip area occupied by a memory cell region (memory cell occupation ratio) is reduced. This leads to an increase in the chip area. In other words, this leads to an increase in manufacturing cost for the chip and a reduction in yield. Moreover, as the number of combinations of memory bank capacities is increased, the number of combinations of operation verifications indispensable for development is increased, leading to an increase in man-hours.

SUMMARY OF THE INVENTION

According to one aspect of the present invention, a non-volatile semiconductor memory device comprises a plurality of memory banks each including a plurality of memory cells, a command recognition section for identifying an externally input command signal and outputting an identification signal, an internal control section for generating a control signal for executing a command designated by the identification signal, an address control section for generating an internal address signal to a memory region including an arbitrary combination of the plurality of memory banks to be accessed, based on the externally input address signal, and a first address inversion section for inverting or non-inverting the logical values of at least a specific bit of the input address signal and outputting the resultant input address signal to the address control section. Predetermined memory cells are accessed based on the control signal and the internal address signal. Thereby, the above-described object is achieved.

According to another aspect of the present invention, a non-volatile semiconductor memory device comprises a plurality of memory banks each including a plurality of memory cells, a command recognition section for identifying an externally input command signal and outputting an identification signal, an internal control section for generating a control signal for executing a command designated by the identification signal, an address control section for generating an internal address signal to a memory region including an arbitrary combination of the plurality of memory banks to be accessed, based on the externally input address signal, and a second address inversion section for interchanging at least a specific bit of the input address signal with at least another specific bit thereof and outputting the resultant input address signal to the address control section. Predetermined memory cells are accessed based on the control signal and the internal address signal. Thereby, the above-described object is achieved. The interchange between one specific bit and another specific bit of an input address signal includes interchange of two consecutive specific bits (e.g., the two most significant bits), and interchange of any two specific bits.

In one embodiment of this invention, the first address inversion section comprises a logic inversion section for inverting the logical value of the address signal, and a first output switching section for switching between the same logic output of the address signal and an output of the logic inversion section.

In one embodiment of this invention, the second address inversion section comprises a second output switching section for interchanging at least a specific bit of the input address signal with at least another specific bit thereof.

In one embodiment of this invention, the first output switching section or the second output switching section switches outputs thereof using a wiring pattern provided in a production process of the device.

In one embodiment of this invention, the first output switching section or the second output switching section comprises a memory element capable of setting a state thereof, and a logic element for switching outputs thereof depending on the set state stored in the memory element.

In one embodiment of this invention, the first output switching section or the second output switching section comprises a logic element for switching outputs thereof depending on an externally input logical value.

In one embodiment of this invention, the memory capacity of the memory bank is $\frac{1}{2}^n$ of the capacity of the overall memories (e.g., the memory banks) where n is a natural number.

In one embodiment of this invention, the non-volatile semiconductor memory device is an electrically writable and erasable flash memory.

According to another aspect of the present invention, a non-volatile semiconductor memory device comprises a plurality of memory blocks each comprising a plurality of memory cells arranged in a matrix, and a plurality of memory banks comprising some of the plurality of memory blocks. The non-volatile semiconductor memory device further comprises an address inversion section for inverting a specific address signal. Therefore, the logical arrangement of the memory banks is made changeable. Thereby, the above-described object is achieved.

According to another aspect of this invention, an information apparatus comprises the above-described non-volatile semiconductor memory device. A memory operation is carried out using the non-volatile semiconductor memory device.

Hereinafter, functions of the present invention will be described. In the present invention, it is possible to invert a specific bit(s) of specific address signals or interchange it with another specific bit(s) to change the logical arrangement of memory banks without changing the physical arrangement of the memory banks. Specifically, by inverting or interchanging specific address signals, the combinations of memory banks having a memory capacity ratio of m:n and n:m (e.g., 1:2 and 2:1) can be obtained by the same internal operation. Therefore, the number of sets of address signals can be reducecd. Thereby, the non-volatile semiconductor memory device having a number of combinations of memory bank capacity ratios can be easily achieved without increasing the number of address signals and address signal lines, reducing a memory cell cccupation ratio, elongating a development time due to increased verification patterns, or the like.

Thus, the invention described herein makes possible the advantages of providing a non-volatile semiconductor memory device in which specific addresses are selectively inverted, or the like, so that the number of combinations of segmentized memory banks can be easily increased without leading to a significant increase in address signals and address signal lines; and an information apparatus using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the non-volatile semiconductor memory device of the present invention will be described by way of illustrative Examples 1 to 3 with reference to the accompanying drawings.

EXAMPLE 1

Figure 1:
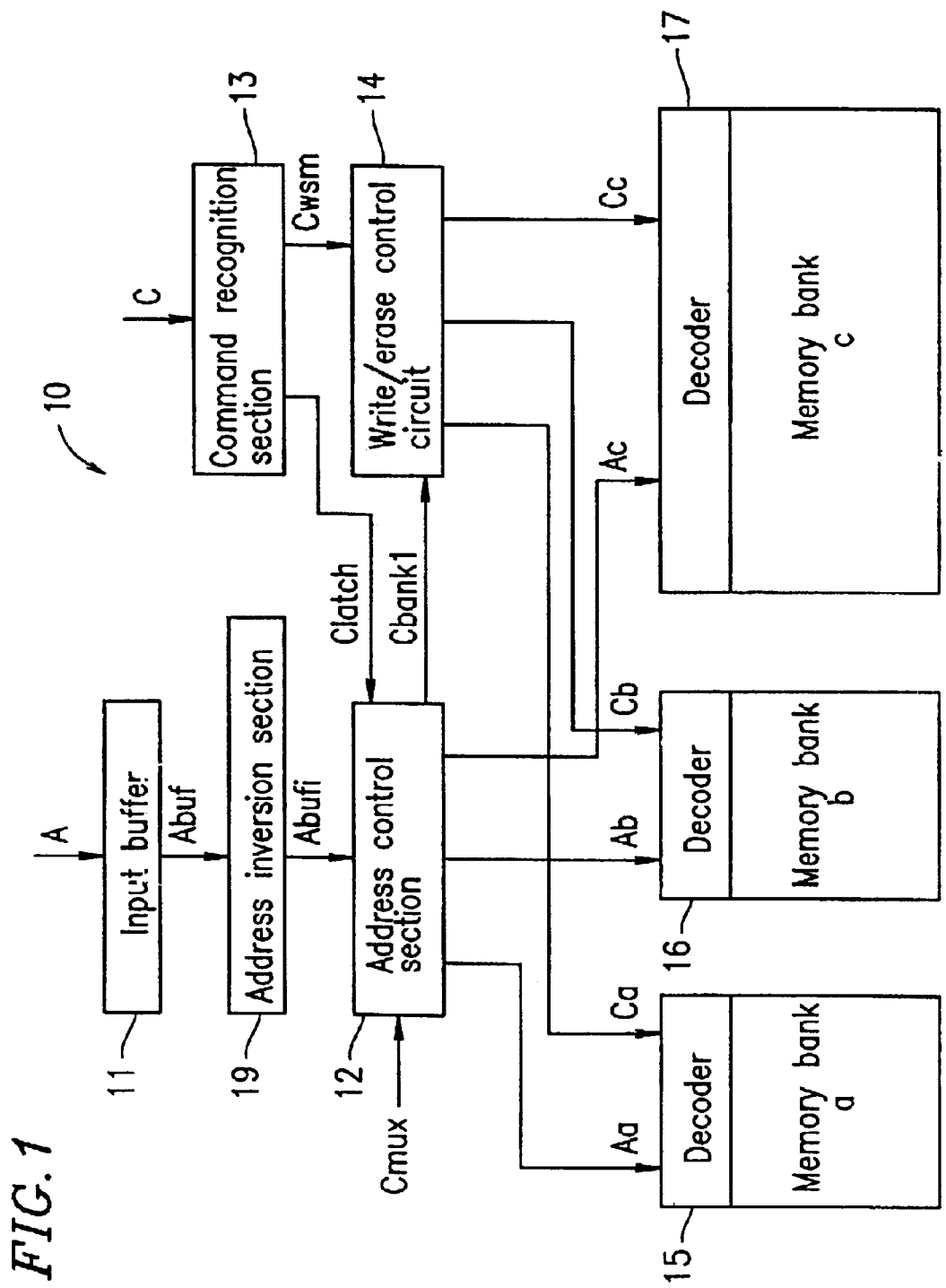
FIG. 1 is a block diagram of a non-volatile semiconductor memory device according to Example 1 of the present invention, showing major parts thereof.

FIG. 1 is a block diagram of a non-volatile semiconductor memory device according to Example 1 of the present invention, showing major parts thereof. It should be noted that a general non-volatile semiconductor memory device includes a data signal carrying information to be written to memory cells, a sense circuit for reading information stored in memory cells, and a high-voltage-related circuit, such as a booster circuit and the like. These are not specifically involved in the present invention and therefore are not shown. The structure and operation of such elements are not described unless particularly required.

In FIG. 1, a non-volatile semiconductor memory device 10 according to the present invention has an input buffer 11, an address control circuit 12 as an address control section, a command recognition section 13, a write/erase control circuit 14 as an internal control section, three memory banks a to a, decoder circuits 15 to 17 connected to respective memory banks a to a, and an address inversion section 19 as a first address inversion section.

An address signal A is input to the input buffer 11 from an external address pad (not shown).

An address signal Abuf is input to the address inversion section 19 from the input buffer 11. The address inversion section 19 inverts or non-inverts the logical value of a specific bit of the input address signal Abuf and outputs the resultant address signal Abufi to the address control circuit 12.

Figure 2:
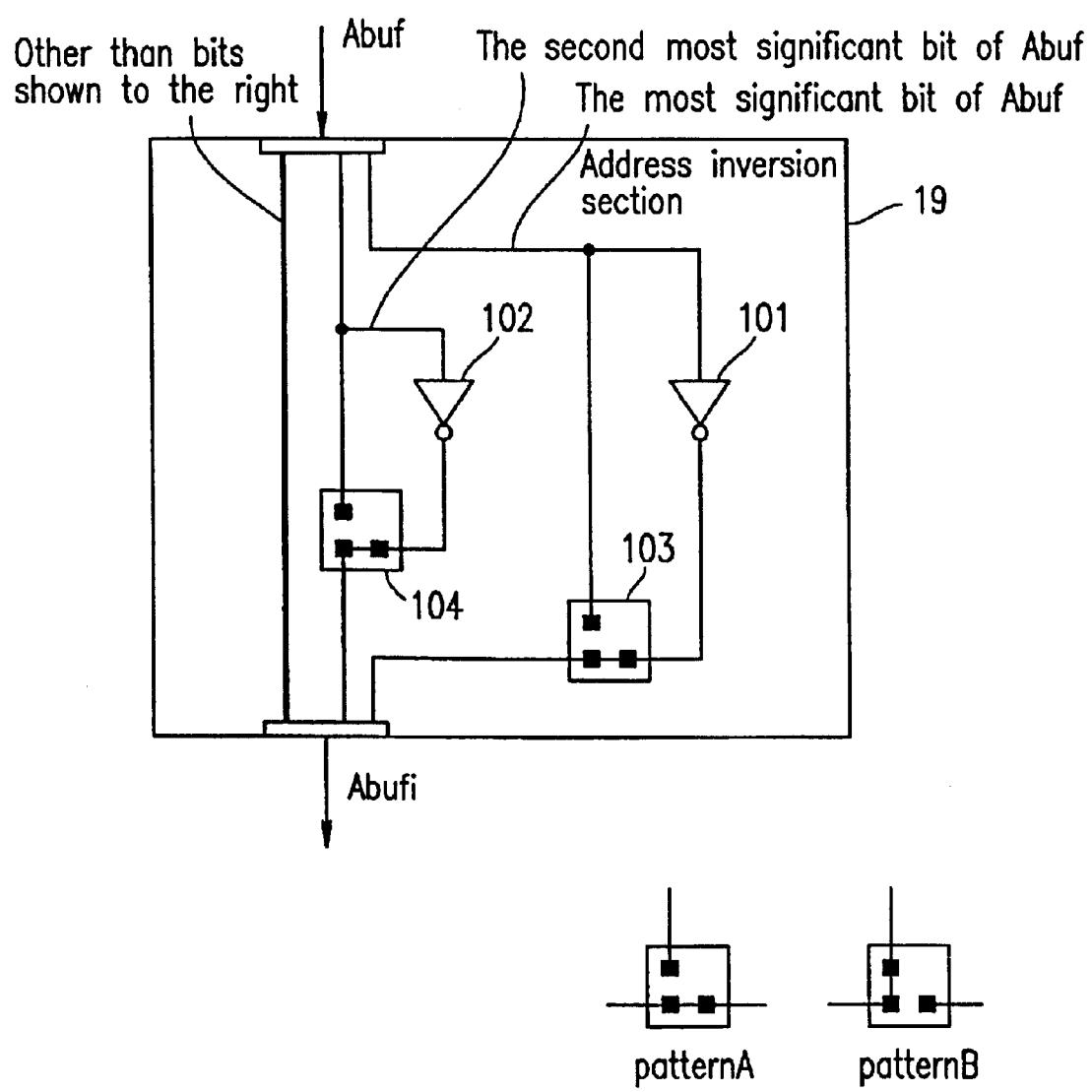
FIG. 2 is a block diagram showing an exemplary address inversion section of FIG. 1.

More specifically, referring to FIG. 2, the address inversion section 19 has an inverter 101 connected to the bit line of the most significant bit of the input address signal Abuf, an inverter 102 connected to the bit line of the second most significant bit of the input address signal Abuf, a switching pattern 103 for invalidating the logic of the inverter 101, and a switching pattern 104 for invalidating the logic of the inverter 102.

These inverters 101 and 102 constitute a logic inversion section (logic inversion circuit). The logic inversion section inverts the logical value of an input signal, i.e., an address signal. The switching patterns 103 and 104 constitute a first output switching section. The first output switching section switches between the outputs of the same logic of the address signal and the inverted logic thereof.

These switching patterns 103 and 104 can be switched between pattern A and pattern B (FIG. 2) by changing a layout wiring pattern using a different hard mask. When the switching patterns 103 and 104 are both arranged as pattern A, the logic of the inverters 101 and 102 is valid, so that the address inversion section 19 outputs the address signal Abuf, only whose most significant bit and second most significant bit are inverted, as an address signal Abufi. When the switching patterns 103 and 104 are both arranged as pattern B, the logic of the inverters 101 and 102 are invalid, so that the address inversion section 19 outputs the address signal Abuf as it is, as the address signal Abufi.

The command recognition section 13 receives a command signal C and interprets an input command represented by the command signal C. When the command recognition section 13 recognizes that the input command is a valid command, the command recognition section 13 outputs a latch control signal Clatch to the address control circuit 12 and a control signal Cwsm (identification signal), which identifies the type of the input command, to the write/erase control circuit 14.

The address control circuit 12 receives the address signal Abufi from the address inversion section 19 and the latch control signal Clatch from the command recognition section 13. The address control circuit 12 also outputs the bank signal Cbank1 to the write/erase control circuit 14, and address signals Aa to Ac corresponding to respective memory banks to the decoder circuit 15 to 17, respectively.

Figure 3:
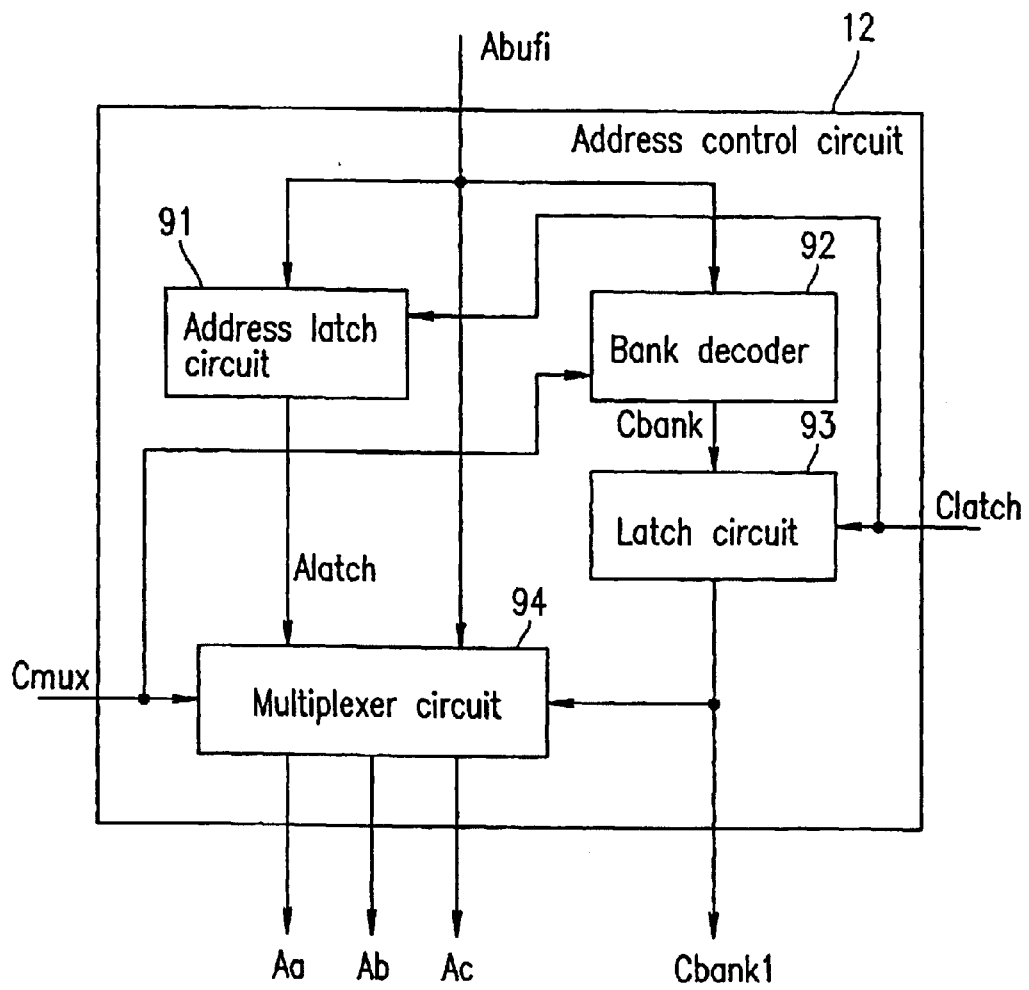
FIG. 3 is a block diagram showing an exemplary address control circuit of FIG. 1.

More specifically, referring to FIG. 3, the address control circuit 12 has an address latch circuit 91 for latching the address signal Abufi using the latch control signal Clatch from the command recognition section 13, a bank decoder 92 for decoding the address signal Abufi input from the address inversion section 19 so as to indicate which memory bank an address represented by the address signal Abufi is directed to, a latch circuit 93 for storing a bank signal Cbank output by the bank decoder 92 in response to the latch control signal Clatch, and a multiplexer circuit 94 for performing connection control based on a bank signal Cbank1 from the latch circuit 93 so that an address signal Alatch latched by the address latch circuit 91 and the address signal Abufi correspond to respective address signals Aa to Ac on three lines.

It is assumed that memory banks a and b have the same memory capacity which is half the memory capacity of memory bank a. When the address inversion section 19 employs switching pattern B, there are the following combinations of memory bank capacities: a combination of (a) and (b+c) having a memory capacity ratio of 1:3 and a combination of (a+b) and (a) having a memory capacity ratio of 2:2 (1:1).

The switching between the above-described two memory capacity combinations is carried out in response to the control signal Cmux externally input to the address control circuit 12. When the control signal Cmux designates the memory capacity ratio of 1:3, the bank decoder 92 decodes the address signal Abufi so as to indicate whether an address represented by the address signal Abufi is directed to memory bank a or memory bank b or a, and outputs the bank signal Cbank1 representing the memory bank designated by the address signal Abufi to the multiplexer circuit 94 and the write/erase control circuit 14.

The multiplexer circuit 94 performs connection control so that the address signal Alatch stored by the address latch circuit 91 and the address signal Abufi correspond to the address signal Aa and the address signals Ab and Ac, respectively. In this case, since the control signal Cmux designates the memory capacity ratio of 1:3, the multiplexer circuit 94 directs the address signal Aa and the address signals Ab and Ac to signal paths separated logically and electrically. The address signal Ab and the address signal Ac are subjected to logical connection control so that they correspond to the same address signal Abufi.

When the control signal Cmux designates the memory capacity ratio of 1:1, the bank decoder 92 decodes the address signal Abufi as to indicate whether an address represented by the address signal Abufi is directed to memory bank a or b, or memory bank c, and outputs the bank signal Cbank1 representing the memory bank designated by the address signal Abufi to the multiplexer circuit 94 and the write/erase control circuit 14.

The multiplexer circuit 94 performs connection control so that the address signal Alatch stored by the address latch circuit 91 and the address signal Abufi correspond to the address signals Aa and Ab and the address signal Ac, respectively. In this case, since the control signal Cmux designates the memory capacity ratio of 1:1, the multiplexer circuit 94 directs the address signals Aa and Ab and the address signal Ac to signal paths separated logically and electrically. The address signal Aa and the address signal Ab are subjected to logical connection control so that they correspond to the respective memory banks.

Hereinafter, a memory map of the semiconductor memory device of Example 1 will be described with reference to FIG. 4.

Figure 4:
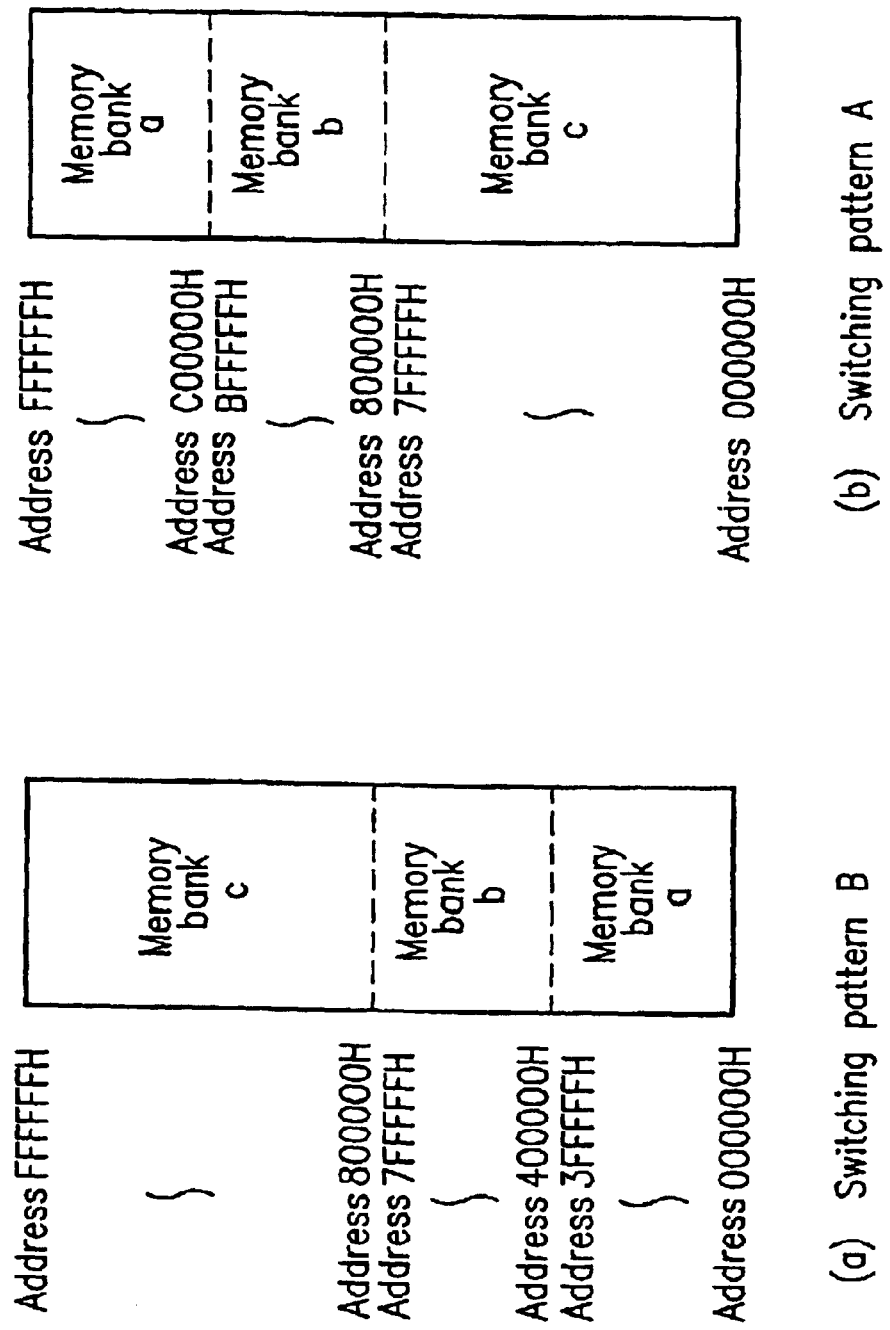
FIG. 4 is a diagram showing memory maps of the non-volatile semiconductor memory device of FIG. 1.

In FIG. 4, it is assumed that the bit width of the address signal A is 24 bits. It is also assumed that memory banks a and b have the same memory capacity and memory bank c has a memory capacity twice as much as the memory capacity of memory banks a and b. In other words, the memory capacities of memory banks a and b are each ¼ of the total capacity of the overall memories, while the capacity of memory bank C is ½ of the total capacity of the overall memories.

Here, it is assumed that the switching patterns 103 and 104 in the address inversion section 19 are both arranged as pattern B. It is also assumed that an address value ascends in order of memory banks a→b→c. In this case, since the logic of the inverters 101 and 102 is invalid as described above, the address signal Abufi is the same as the address signal Abuf. The resultant memory map is shown on the left side of FIG. 4 (switching pattern B).

Next, it is assumed that the switching patterns 103 and 104 in the address inversion section 19 are both arranged as pattern A. In this case, as described above, the logic of the inverters 101 and 102 is valid, the address signal Abuf whose most significant bit and second most significant bit are only inverted is output as the address signal Abufi.

The resultant memory map is shown on the right side of FIG. 4 (switching pattern A). Comparing the memory maps on the left and right sides of FIG. 4, it is observed that the logical positions (relative positions) of the memory banks are vertically transposed. In this case, when pattern B is adapted, the internal operation is the same as when the address signal A, whose most significant bit and second most significant bit are inverted with respect to the above-described address signal A, is input.

The write/erase control circuit 14 receives the bank signal Cbank1 from the address control circuit 12 and the control signal Cwsm identifying the type of a command from the command recognition section 13, and executes the command (e.g., write mode and the like) designated by the control signal Cwsm for the decoder circuit of a predetermined memory bank designated by the bank signal Cbank1 (e.g., the decoder circuit 15 of memory bank a) to, for example, generate a write control signal Ca, and output the control signal Ca to the decoder circuit 15.

The decoder circuits 15 to 17 receive the respective address signals Aa to Ac from the address control circuit 12 and the write/erase control signals Ca to Cc from the write/erase control circuit 14, and cause memory cells in memory bank a selected by the address signal Aa to be in a write mode, for example.

An operation of the above-described configuration will be described.

Based on the above descriptions, it is assumed that the switching pattern B is adopted, and the control signal Cmux designates the memory capacity ratio of 1:3. It is also assumed that while memory bank a is subjected to a write operation, memory bank a is subjected to a read operation. Such address control will be described below.

When the memory device 10 is instructed to do a write operation to memory bank a, the command signal C contains a command for the write operation, and the address signal A contains an address of memory bank a. The command recognition section 13 recognizes the command signal C as a write command (valid command), and activates the latch control signal Clatch. The command recognition section 13 also outputs the control signal Cwsm (identification signal) identifying the type of the command signal C to the write/erase control circuit 14 to inform that the command signal C is a write command.

The input buffer 11 receives the address signal A and outputs the address signal Abuf to the address inversion section 19. Since the switching pattern B is adopted, the address signal Abufi having the same logic as that of the address signal Abuf is transferred to the address control circuit 12.

The address control circuit 12 receives the activated latch control signal Clatch from the command recognition section 13, and stores the address signal Abufi in the address latch circuit 91. The address latch circuit 91 outputs the address signal Alatch which represents an address for selecting memory cells to be subjected to a write operation.

The bank decoder 92 decodes the input address signal Abufi as to which bank the address is directed to (here, whether the address is in memory bank a or memory bank b to c).

The bank signal Cbank output by the bank decoder 92 is stored in the latch circuit 93 in response to the activation of the latch control signal Clatch. The multiplexer circuit 94 performs connection control based on the bank signal Cbank1 stored in the latch circuit 93 so that the address signal Alatch stored in the address latch circuit 91 corresponds to the address signal Aa, and the address signal Abufi corresponds to the address signals Ab and Ac.

Therefore, the connection control is performed so that the address signal Aa directed to memory bank a corresponds to the address signal Alatch stored in the address latch circuit 91, and the address signals Ab and Ac directed to memory banks b and c correspond to the address signal Abufi output by the address inversion section 19.

The write/erase control circuit 14 receives the bank signal Cbank1, inactivates the write/erase control signal Ca to memory bank a, and controls the decoder circuit 15, thereby causing memory cells in memory bank a selected by the address signal Aa to be in the write mode.

The address signals Ab and Ac directed to the respective memory banks b and c are logically and electrically separated from the address signal Aa directed to memory bank a by the multiplexer circuit 94 in the address control circuit 12. The address signals Ab and Ac are also connected and controlled to correspond to the address signal Abufi from the address inversion section 19. In this situation, memory cells in memory banks b and c can be arbitrarily selected irrespective of an address of memory bank a selected in response to address designation along with an external read operation request.

A read operation from memory bank a when a write/erase operation is being carried out for memory banks b and c, is similarly carried out. In this case, in the multiplexer circuit 94, the connection control is carried out so that the address signal Abufi output by the address inversion section 19 corresponds to the address signal Aa directed to memory bank a, and the address signal Alatch stored in the address latch circuit 91 corresponds to the address signals Ab and Ac directed to memory banks b and c.

Even when the control signal Cmux designates the memory capacity ratio of 1:1, the multiplexer circuit 94 can separate the address signals Aa and Ab from the address signal Ac logically and electrically. The memory device having the 1:1 configuration can be achieved by operations similar to those in the 1:3 configuration.

In the case of the above-described switching pattern B, although the memory capacity ratios of 1:3 and 1:1 can be achieved, the memory capacity ratio of 3:1 cannot be achieved. However, by adopting switching pattern A in the address inversion section 19 of the present invention, it can be seen from FIG. 4 that the operation for the memory capacity ratio of 3:1 can be achieved in a similar manner to that for the memory capacity ratio of 1:3 in the case of the above-described switching pattern B. Specifically, in Example 1, if the most significant bit and the second most significant bit of the address signal A is "0" and "0", the address signal A indicates memory bank a. If "0" and "1", the address signal A indicates memory bank b. If "1" and "0" or "1" and "1", the address signal A indicates memory bank c. In this case, a combination of the memory capacities of 1:3 and 1:1 is possible as described above.

In this situation, it is assumed that the switching pattern A is adopted. When the most significant bit and the second most significant bit of the address signal A are "0" and "0" or "0" and "1", the address signal A indicates memory bank c. If "1" and "0", the address signal A indicates memory bank b. If "1" and "1", the address signal A indicates memory bank a. In this case, the possible combinations of the memory capacities are 3:1 and 1:1. The operation when the switching pattern A is used to select the memory capacity combination of 3:1 is the same as that when the switching pattern B is used to select the memory capacity combination of 1:3, except for the operation of the address inversion section 19.

As described above, by inverting a specific portion of an address signal (in Example 1, the most significant bit and the second most significant bit) by the address inversion section 19, the memory capacity combinations of m:n and n:m can be achieved by the same operation.

As described above, according to Example 1, address signal lines, the number of which is smaller by one than the conventional example, can be used to achieve the non-volatile semiconductor memory device 10 having combinations, for example, 1:3, 1:1 and 3:1 as described above. The smaller the smallest memory bank capacity (the more the number of combinations of memory capacity ratios), the more significant the above-described effect.

For example, as illustrated in the conventional example, a total of 8 sets of address signals are required in order to achieve a non-volatile semiconductor memory device having 8 memory banks in which memory capacity ratios of from 1:7 to 7:1 can be switched. In contrast, according to the present invention, only four memory banks having a memory capacity of ½, ¼, ⅛ and ⅛ of the total memory capacity is only required. In this case, only a total of 4 sets of address signals are required. This contributes greatly to a reduction in the area of a semiconductor chip. Here, the most to the third most significant bits of an address signal are subjected to inversion.

It should be noted that although in Example 1, the specific bits of an address signal are subjected to inversion or non-inversion by the inverter and the switching pattern, the present invention is not limited to this. Alternatively, a predecoder which receives the most and second most significant bits of an address signal and outputs a memory bank enable signal for selecting a memory bank, may be used. In this case, by changing specific signals in the predecoder, the same effect to the address inversion section 19 can be achieved.

For example, it is assumed that the capacity ratio of the memory banks is 1:3. When the most and second most significant bits of an address signal are "0" and "0", the predecoder outputs a signal for enabling memory bank a. If "0" and "1", an enable signal for memory bank b is output. If "1" and "0", an enable signal for memory bank c is output. Next, it is assumed that the capacity ratio of memory banks is 3:1. When the most and second most significant bits of an address signal are "0" and "0" or "0" and "1", the predecoder outputs a signal for enabling memory bank c. If "1" and "0", an enable signal for memory bank b is output. If "1" and "1", an enable signal for memory bank a is output. The latter operation can be obtained by changing an internal signal containing the upper two bits of addresses, i.e., "0, 0"→"1, 1", "0, 1"→"1, 0", "1, 0"→"0, 1", "1, 1"→"0, 0".

EXAMPLE 2

Although in Example 1, address signals are subjected to logic inversion in the address inversion section 19, an alternative method is provided in Example 2 in which the address signals are not subjected to the logic inversion. In Example 2, the most significant bit and the second most significant bit are transposed, thereby making it possible to easily increase the number of combinations of memory bank capacities without a significant increase in address signals.

Figure 5:
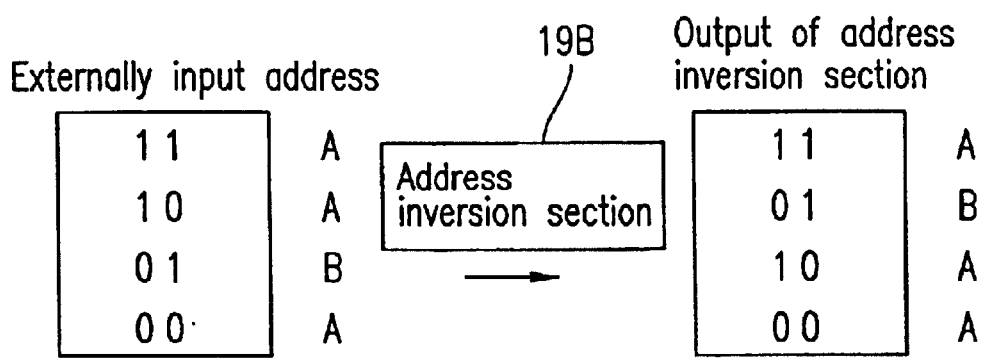
FIG. 5 is a diagram showing an exemplary operation of an address inversion section in Example 2 of the present invention.

In Example 1, the memory bank capacity is m:n, such as for example "24 M+8 M". Thus, the memory bank which performs the dual work is divided by a single border. In Example 2, there are a plurality of borders in the memory bank, such as for example "16 M+8 M+8 M". For the sake of simplicity, as shown in FIG. 5, it is assumed that memory banks are represented by A and B, and the memory capacity ratio of A and B is 3:1.

Figure 6:
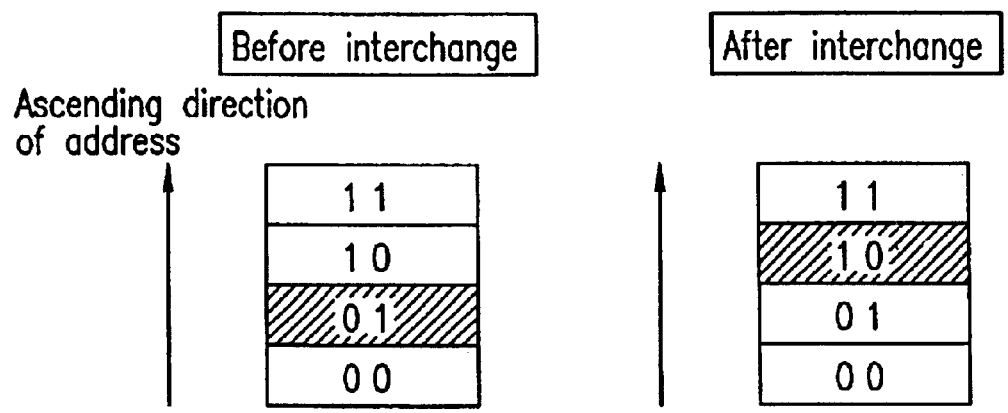
FIG. 6 is a diagram showing states of memory banks before and after interchange of specific addresses by the address inversion section of FIG. 5.

For example, the most significant bit (one specific bit) of an address is interchanged with the second most significant bit (the other specific bit) of the address by an address inversion section 19B as a second address inversion section (bit line interchange section). As a result, the externally input address is changed to an output of the address inversion section 19B as shown in FIG. 5. As can be seen from FIG. 5, the memory bank B and the memory bank A at the top second position are transposed. In this case, FIG. 6 shows the memory map before and after the interchange. Thus, the interchange of the bit lines is an effective means for interchanging two memory banks A and B which are positioned at a middle of the memory space as shown in FIG. 6.

Here, it is assumed that the convenience of software or the like requires for a specific address space to be allocated to the memory bank A (or B). By configuring two variations, (8 M+8 M+16 M) and (16 M+8 M+8 M), on the same semiconductor chip, such a situation can be flexibly handled. This results in the same effect as that obtained by inverting an address so as to change the configuration of memory bank capacity, for example, from 24 M+8 M to 8 M+24 M.

As described above, in Example 1, a single border separates memory regions capable of operating separately. As in Example 2, it maybe desired, according to limitation in system configuration or software, that a specific address space is allocated in a specific memory bank. Such a situation can be handled by using a plurality of borders between memory regions.

Figure 7:
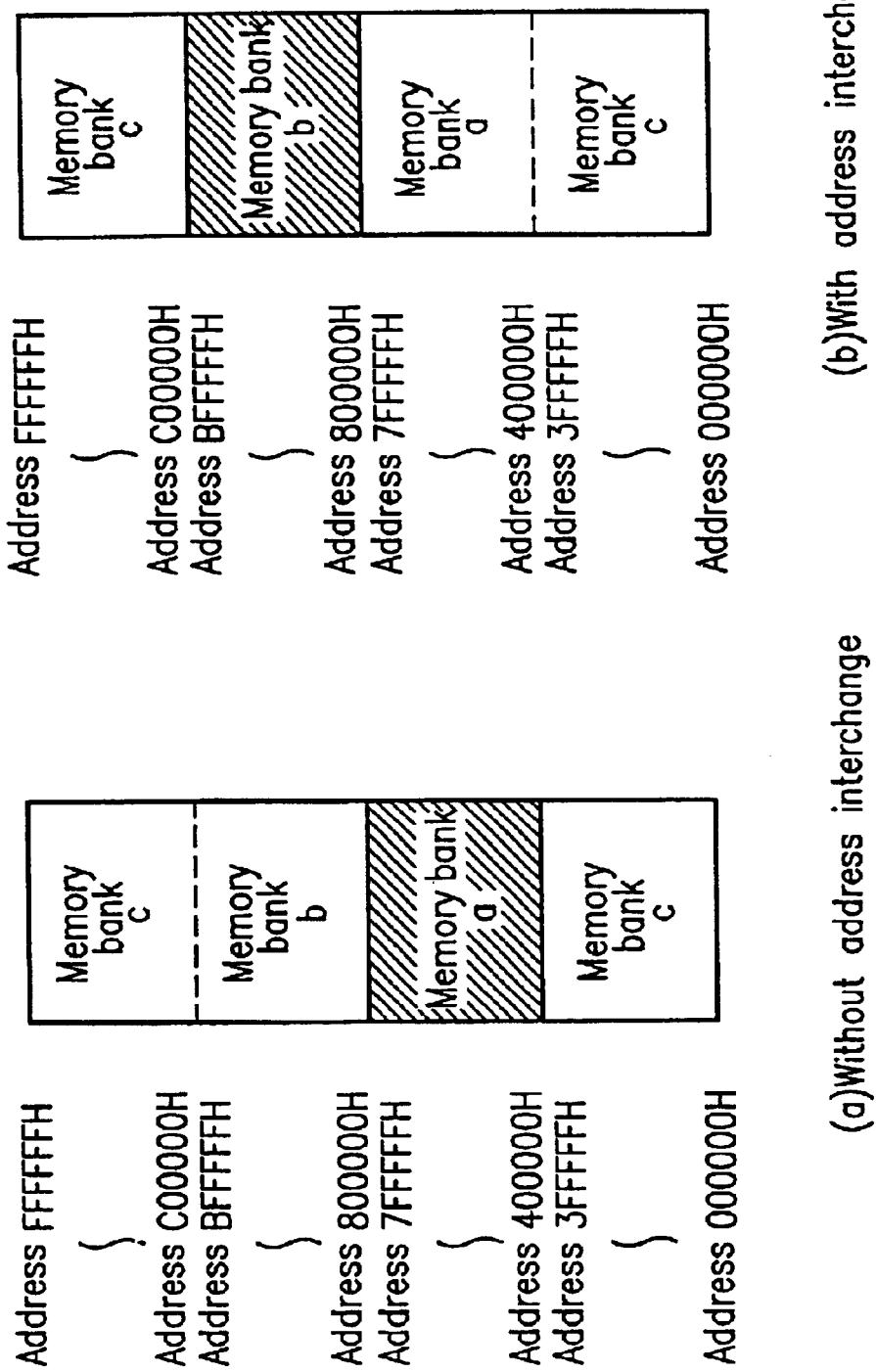
FIG. 7 is a diagram showing a memory map of a non-volatile semiconductor memory device having the address inversion section of FIG. 5.

According to Example 2, a configuration of a memory bank is considered to have a combination of [(½)c]·(a)19 [b+(½)c] or [(½)c+a]·(b)·[(½)c], as shown in FIG. 7 depending on the presence or absence of the interchange of an address. As described above, the capacity of memory bank c is twice as much as the other memory banks a and b. Therefore, the memory capacity ratio of the former combination is 1:1:2 while the memory capacity ratio of the latter combination is 2:1:1. In order to switch between these combinations, the address inversion section 19B (FIG. 5) having a second output switching section is used to switch (interchange) between the bit lines of the most significant bit and the second most significant bit of an address signal instead of the address inversion section 19 (FIG. 1) which inverts the address signal. FIG. 7 shows the memory map in this situation. The underlined (a) and (b) in the above-described memory capacity combinations correspond to the hatched portions in FIG. 7.

Briefly, when a memory region which is a unit of a dual work operation has a single border, the inversion of an address signal (Example 1) is effective, while when there are a plurality of borders, the interchange of an address signal (Example 2) is effective.

It should be noted that the non-volatile semiconductor memory device of Example 2 comprises the address inversion section 19B instead of the address inversion section 19 of FIG. 1. The second output switching section of the address inversion section 19B may perform the switching of outputs using a wiring pattern provided in a production process.

EXAMPLE 3

In Example 1, the inversion of specific addresses is carried out by a hard mask. In this case, the logical arrangement of memory banks cannot be transposed or interchanged after a chip is completed. To circumvent this situation, in Example 3, the address inversion section 19A employing a logical element (or logical circuit) which inverts an address according to an externally input logical value is provided between the input buffer 11 and the address control circuit 12. Therefore, even after a chip is completed, it is possible to transpose (or interchange) the logical arrangement of memory banks.

Figure 8:
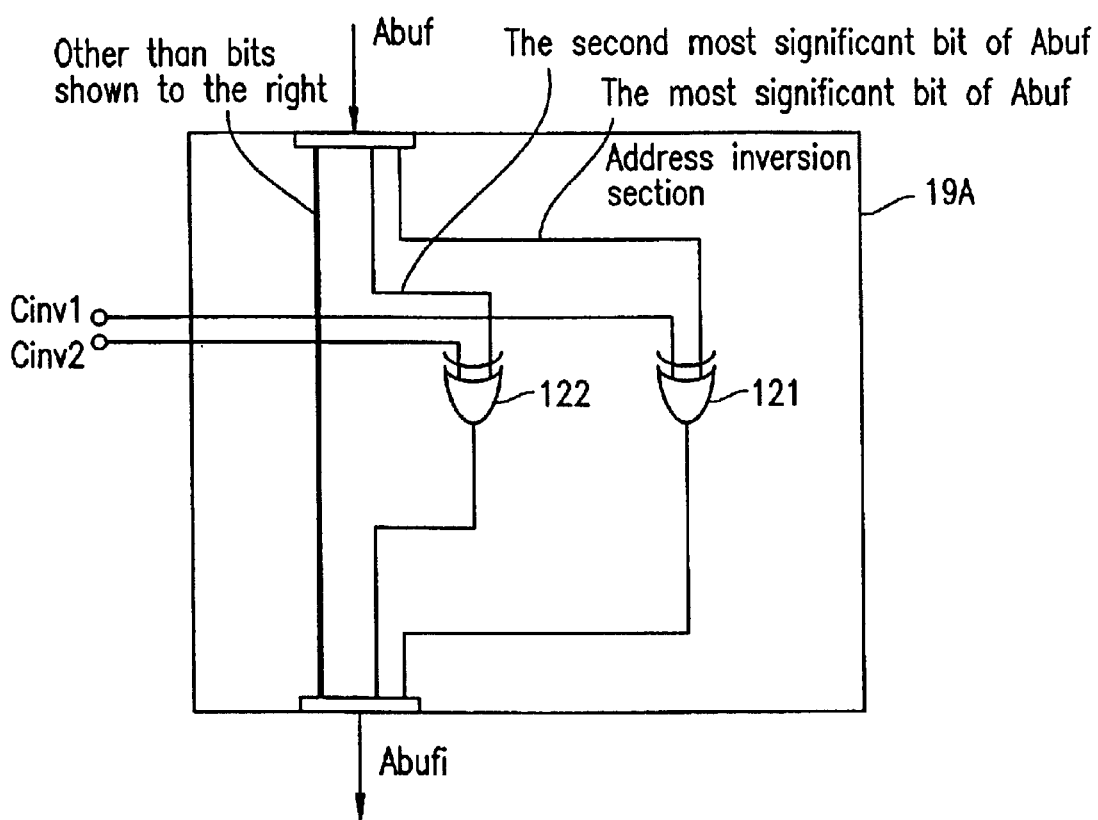
FIG. 8 is a block diagram showing another exemplary address inversion section (Example 3) different from that in FIG. 1.
Figure 9:
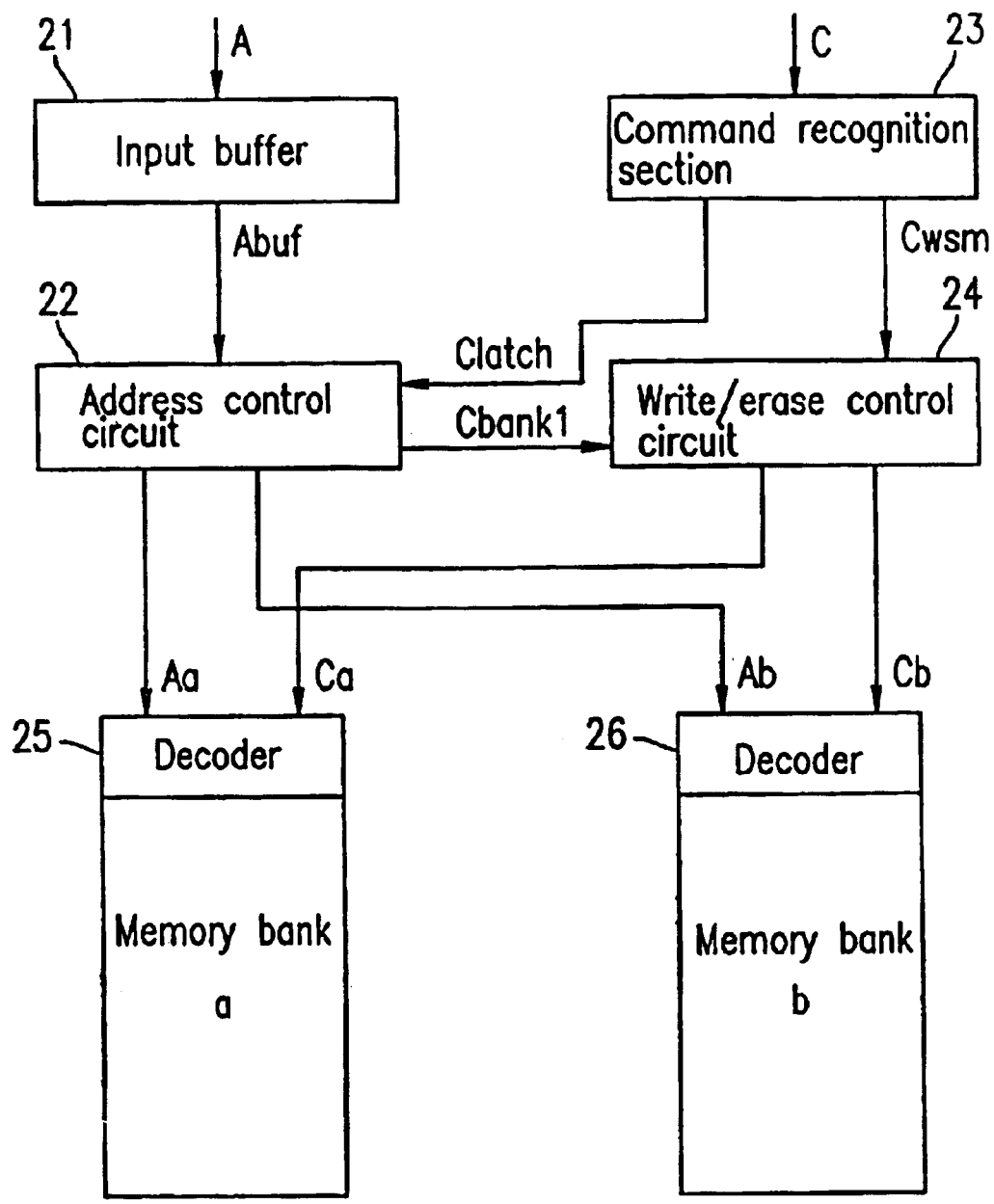
FIG. 9 is a block diagram showing an example of a conventional non-volatile semiconductor memory device.
Figure 10:
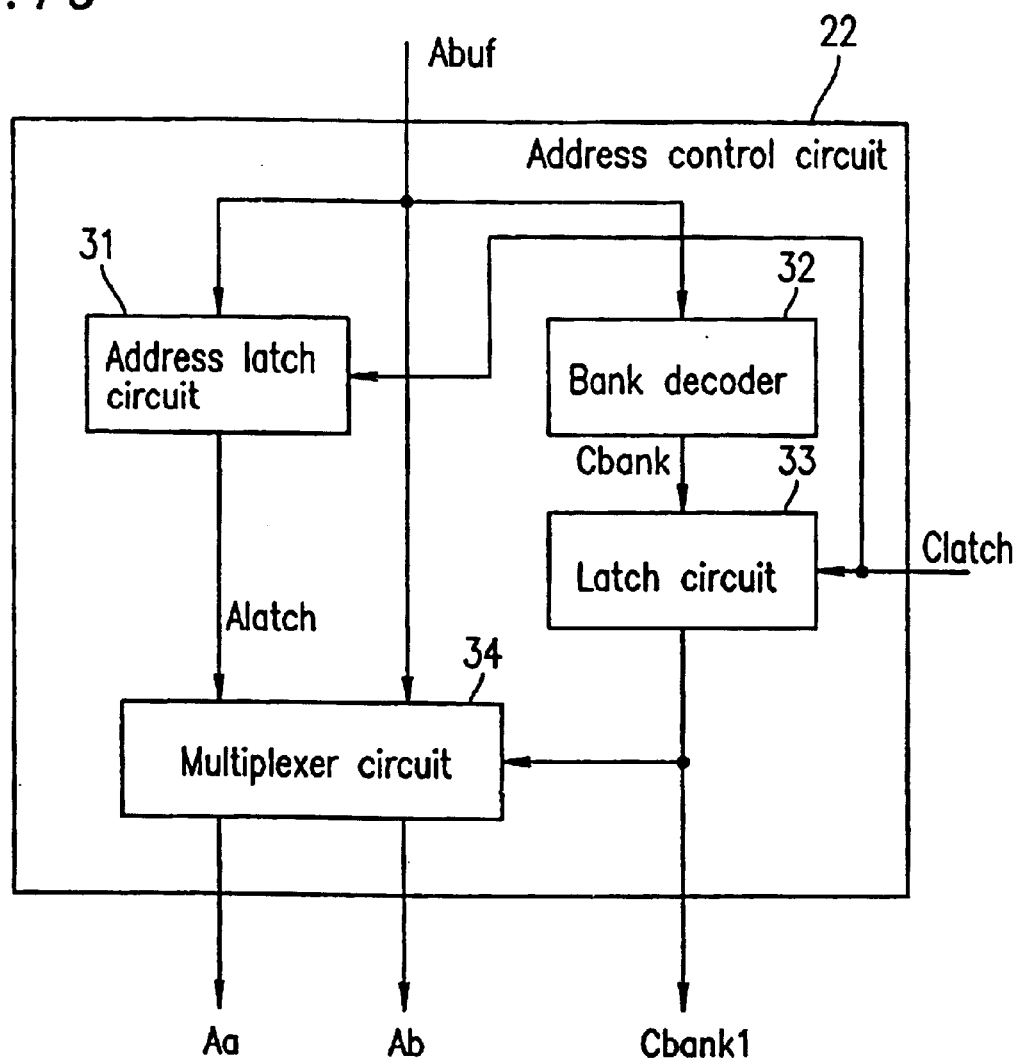
FIG. 10 is a block diagram showing an exemplary address control circuit of FIG. 9.
Figure 11:
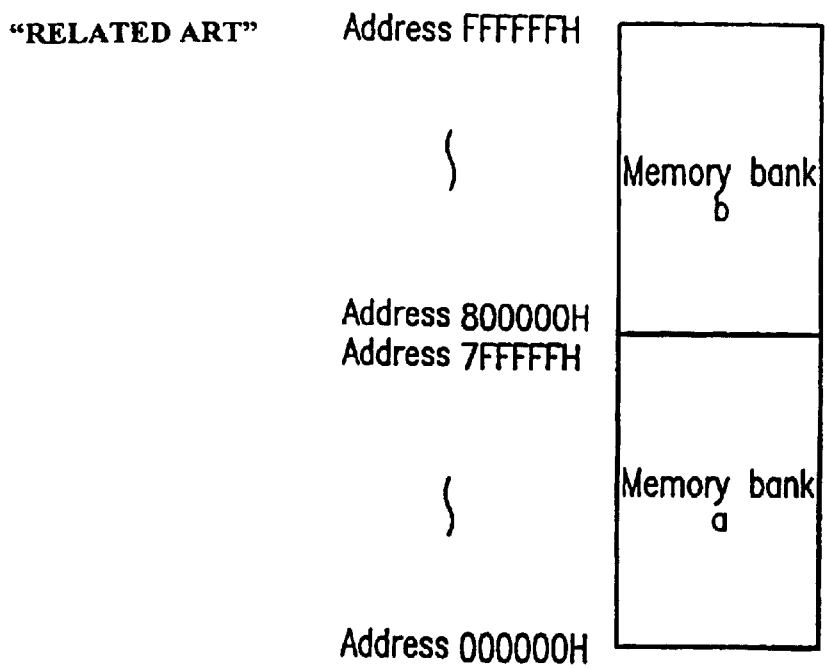
FIG. 11 is a diagram showing a memory map of the non-volatile semiconductor memory device of FIG. 9.
Figure 12:
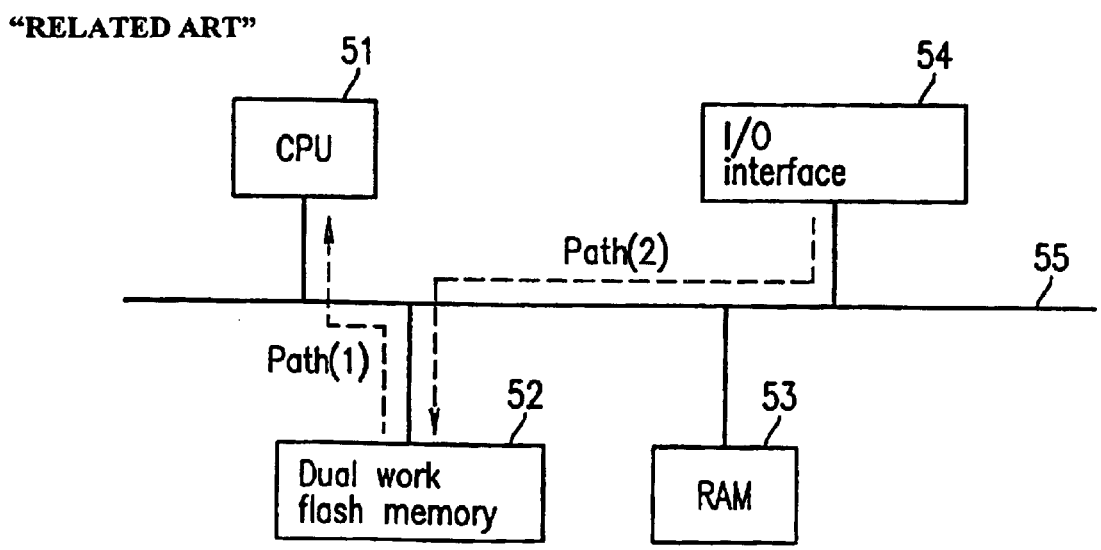
FIG. 12 is a block diagram showing an exemplary system configuration employing a dual work flash memory.
Figure 13:
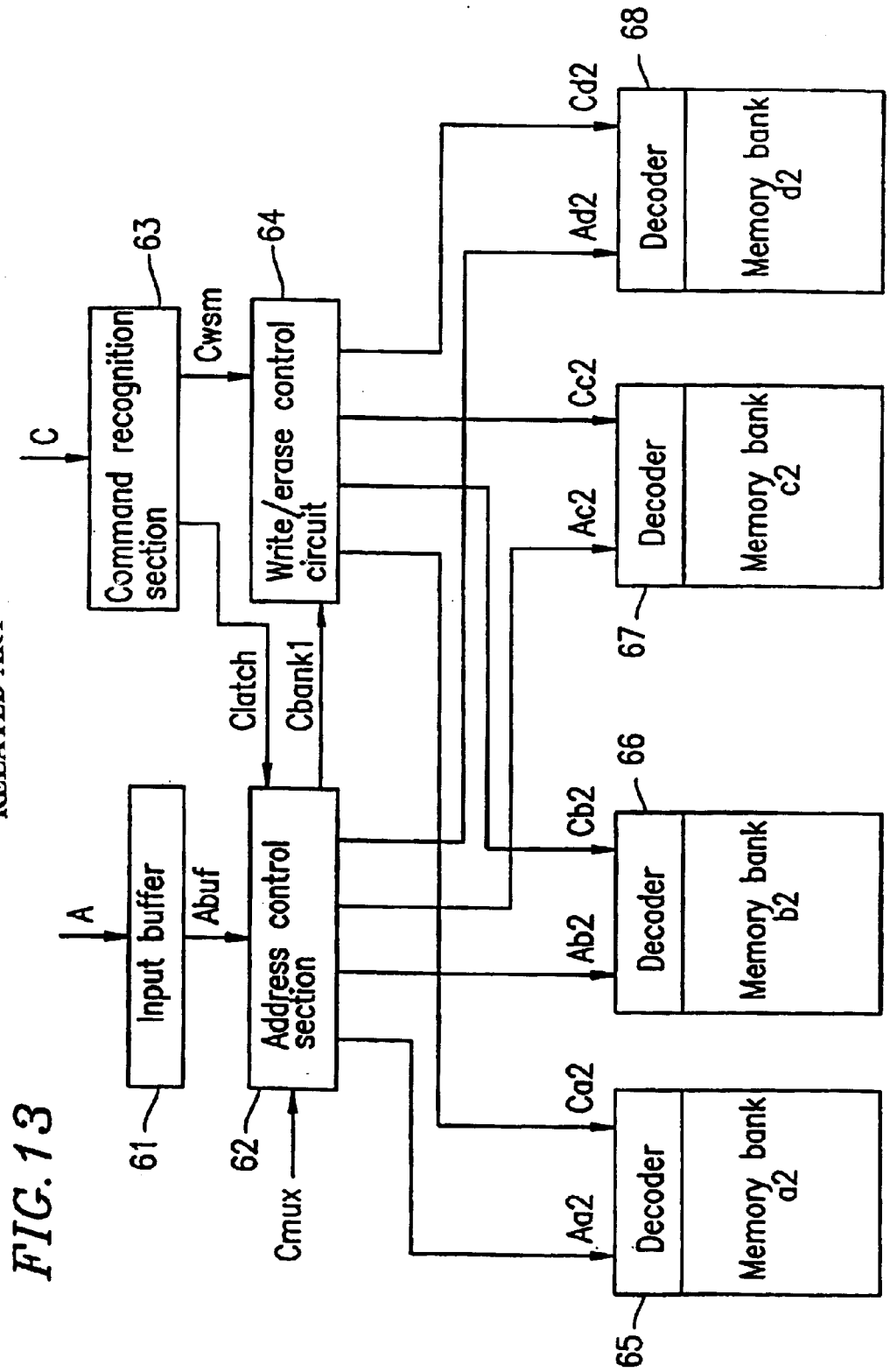
FIG. 13 is a block diagram showing another exemplary non-volatile semiconductor memory device different from that of FIG. 9.
Figure 14:
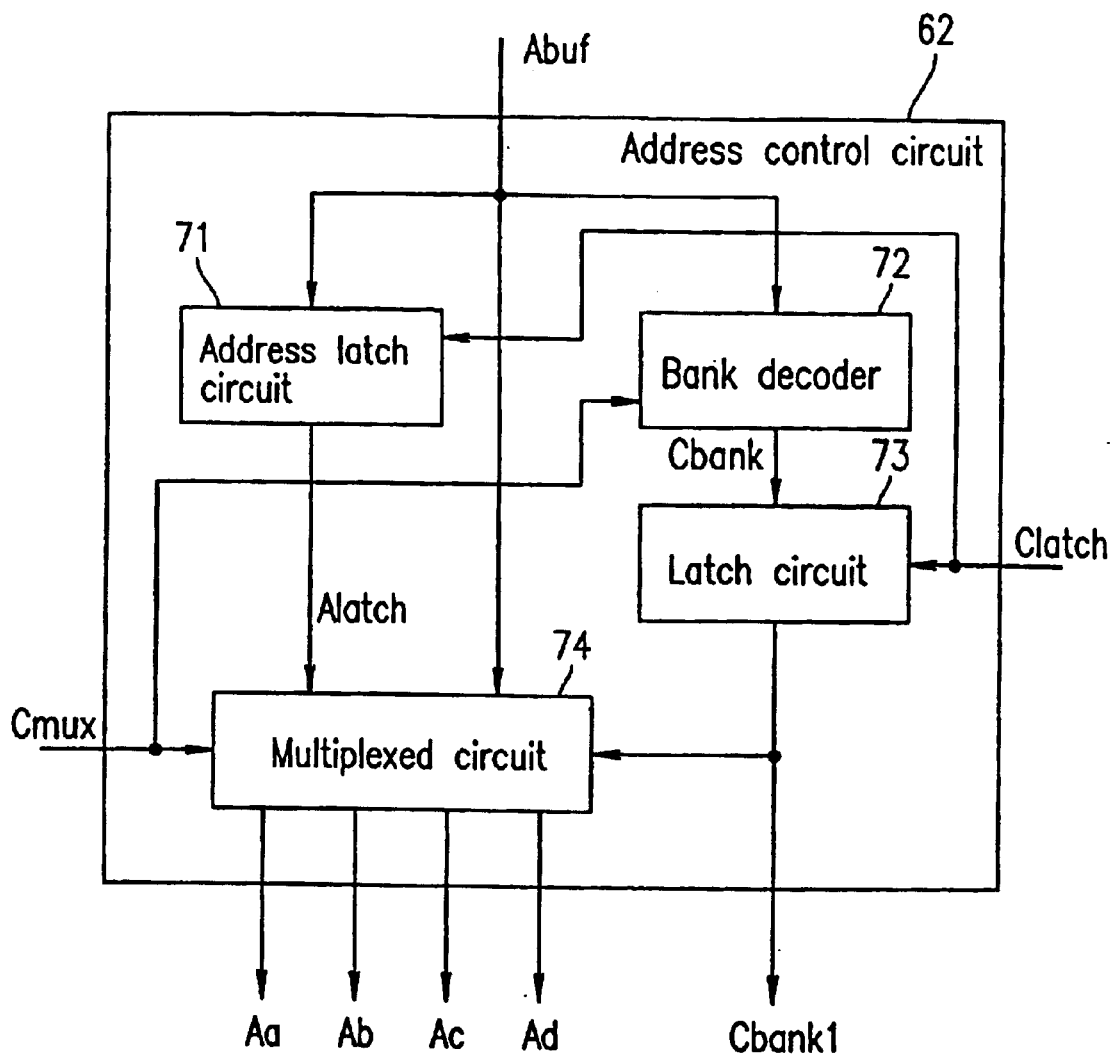
FIG. 14 is a block diagram showing an exemplary address control circuit of FIG. 13.
Figure 15:
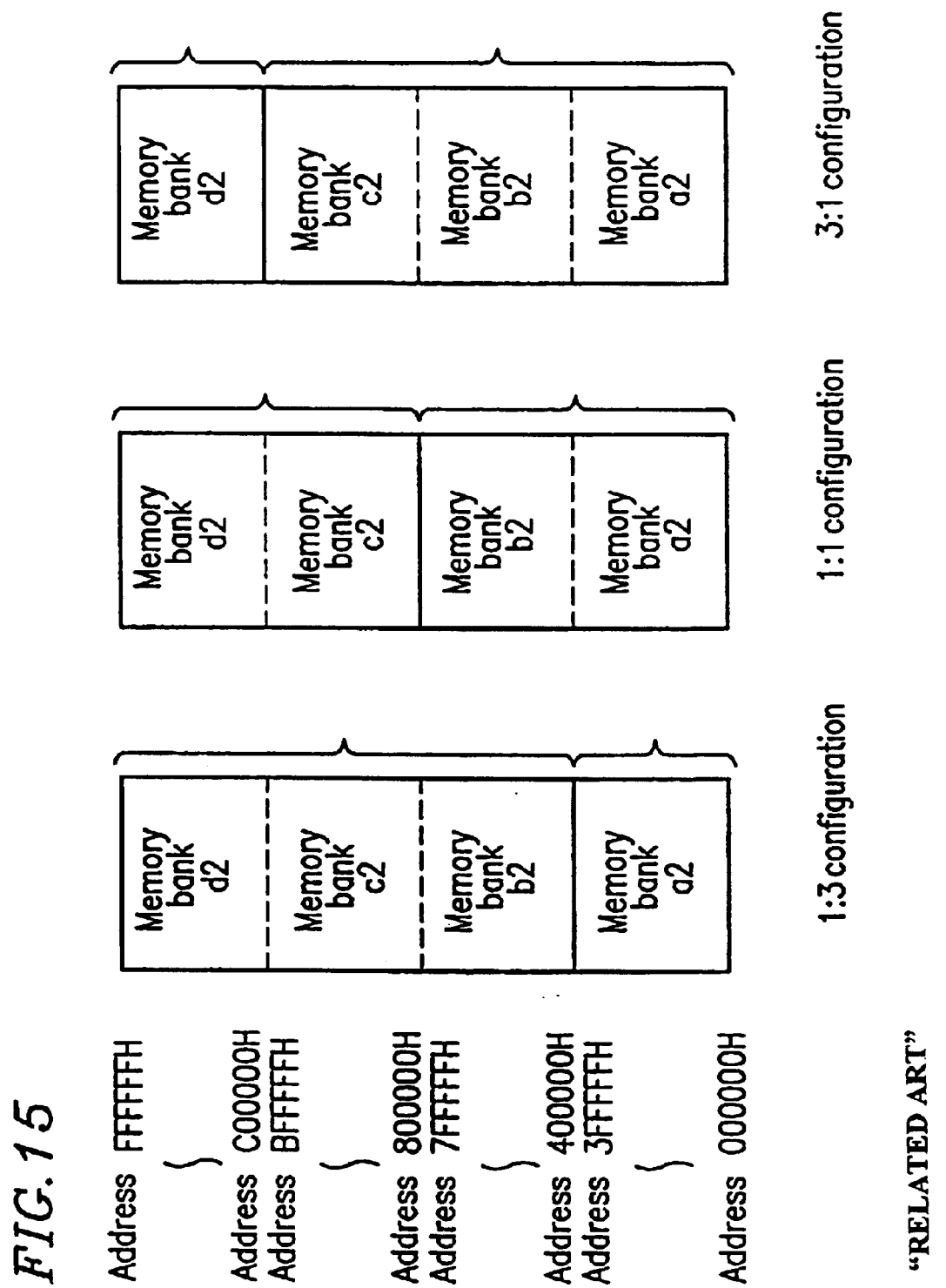
FIG. 15 is a diagram showing memory maps of the non-volatile semiconductor memory device of FIG. 13.

Referring to FIG. 8, the address inversion section 19A has an XOR gate 121 (EXCLUSIVE-OR circuit) connected to the most significant bit line of the address signal Abuf, an XOR gate 122 (EXCLUSIVE-OR circuit) connected to the second most significant bit line of the address signal Abuf, and a separate input terminal of each of control signals Cinv1 and Cinv2.

When the control signal Cinv1 is at an "H" level, the output of the XOR gate 121 is the inverted most significant bit of the address signal Abuf. When the control signal Cinv1 is at an "L" level, the output of the XOR gate 121 is the same logic of the most significant bit of the address signal Abuf. The same goes for the control signal Cinv2. Thus, the use of the XOR gates allows the inversion of specific addresses using the control signal.

If the control signals Cinv1 and Cinv2 are generated based on information stored by a not-shown latch circuit, or the like, the inversion of specific addresses can be easily controlled. Alternatively, if the control signals Cinv1 and Cinv2 are generated based on information stored in a non-volatile semiconductor memory element instead of the information stored by a not-shown latch circuit, the inversion of specific addresses can be controlled after a chip is mounted. Further, if the control signal is connected to an input terminal of a chip so that the chip can be externally controlled, the inversion of specific addresses can be controlled after a chip is mounted. Further, by connecting the input terminal to power source potential or ground potential, it is possible to fix the control of the inversion of specific addresses when a chip is operated.

It should be noted that Examples 1 to 3 of the present invention are only illustrative for the purpose of showing specific examples. Memory bank capacity, a total memory capacity, the number of address bits to be inverted, a combination pattern of memory capacities, the number of address lines, and the like are not limited to Examples 1 to 3. The configuration of each circuit above is only illustrative. The same functions and effects of the present invention can be achieved by various configurations.

Figure 16:
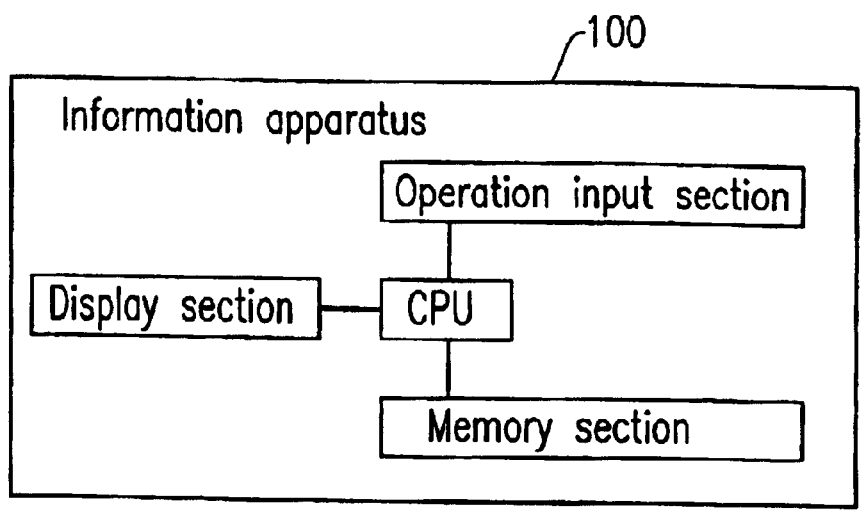
FIG. 16 is a block diagram showing a basic configuration of an information apparatus incorporating the non-volatile semiconductor memory device of the present invention.

Although the non-volatile semiconductor memory device is described in Examples 1 to 3, the non-volatile semiconductor memory device of the present invention can be easily incorporated into information apparatuses, such as portable telephone apparatuses, computers, and the like. In the non-volatile semiconductor memory device, the number of memory bank capacities can be easily increased without an increase in the number of signal lines. For example, as shown in FIG. 16, an information apparatus 100 may comprise: an information memory section such as RAM (SRAM, DRAM, and the like), ROM (flash memory and the like), and the like; an operation input section; a display section for displaying an initial screen, a result of information processing, and the like, such as a liquid crystal display apparatus; and a CPU (central processing unit) for receiving an operation command from the operation input section, and performing various information processes based on a predetermined information processing program or data thereof while performing read/write operations (memory operations) or data transfer operations with respect to the information memory section. In this case, the non-volatile semiconductor memory device of the present invention can be easily employed as the information memory section (ROM).

As described above, according to the present invention, the inversion or interchange of specific addresses can change the logical arrangement of memory banks, so that a smaller number of address signals can be used to easily achieve a greater number of combinations of memory capacities (memory capacity ratio). Therefore, the non-volatile semiconductor memory device of the present invention contributes to a reduction in chip cost and a reduction in development time while keeping convenience.

Further, the inversion of specific addresses is carried out by a control circuit, whereby combinations of memory capacities can be arbitrarily changed after a chip is completed or mounted. Thereby, convenience can be improved.

Furthermore, flash memory, such as dual work flash memories, having a number of memory capacity ratios and a small number of address signals, can be achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device, comprising:
    a plurality of memory banks each including a plurality of memory cells;
    a command recognition section for identifying an externally input command signal and outputting an identification signal;
    an internal control section for generating a control signal for executing a command designated by the identification signal;
    a first address inversion section operating to invert or non-invert the logical values of selected specific bits of an input address signal based on a collection of bit selection signals and outputting the resultant input address signal to an address control section; and
    the address control section for generating an internal address signal to a memory region including an arbitrary combination of the plurality of memory banks to be accessed, based on the input address signal received from the first address inversion section,
    wherein predetermined memory cells are accessed based on the control signal and the internal address signal.

2. A non-volatile semiconductor memory device according to claim 1, wherein the first address inversion section comprises:
    a logic inversion section for inverting the logical value of the address signal; and
    a first output switching section for switching between the same logic output of the address signal and an output of the logic inversion section based on the collection of bit selection signals.

3. A non-volatile semiconductor memory device according to claim 2, wherein the collection of bit selection signals are based on a wiring pattern provided in a production process of the device.

4. A non-volatile semiconductor memory device according to claim 2, wherein the first output switching section comprises:
    a memory element capable of setting a state thereof; and
    a logic element for switching outputs thereof depending on the set state stored in the memory element,
    wherein the outputs of the logic element control which of a plurality of collections of bit selection signals are the collection of bit selection signals upon which the operation of the first address inversion section is based.

5. A non-volatile semiconductor memory device according to claim 2, wherein the first output switching section comprises:
    a logic element for switching outputs thereof depending on an externally input logical valve.

6. A non-volatile semiconductor memory device according to claim 1, wherein the memory capacity of each memory bank is $\frac{1}{2}^n$ of the capacity of the overall memories where n is a natural number that may vary according to the particular memory bank.

7. A non-volatile semiconductor memory device according to claim 1, wherein the non-volatile semiconductor memory device is an electrically writable and erasable flash memory.

8. A non-volatile semiconductor memory device, comprising:
    a plurality of memory banks each including a plurality of memory cells;
    a command recognition section for identifying an externally input command signal and outputting an identification signal;
    an internal control section for generating a control signal for executing a command designated by the identification signal; an address inversion section for inverting or non-inverting the logical values of at least a specific bit of an input address signal and outputting the resultant input address signal to an address control section; and
    the address control section for generating an internal address signal to a memory region including an arbitrary combination of the plurality of memory banks to be accessed, based on the input address signal received from the address inversion section,
    wherein predetermined memory cells are accessed based on the control signal and the internal address signal.

9. A non-volatile semiconductor memory device according to claim 8, wherein the first address inversion section comprises:
    an output switching section for interchanging at least a specific bit of the input address signal with at least another specific bit thereof.

10. A non-volatile semiconductor memory device according to claim 9, wherein the second output switching section switches outputs thereof using a wiring pattern provided in a production process of the device.

11. A non-volatile semiconductor memory device according to claim 9, wherein the output switching section comprises:
    a memory element capable of setting a state thereof; and
    a logic element for switching outputs thereof depending on the set state stored in the memory element.

12. A non-volatile semiconductor memory device according to claim 9, wherein the output switching section comprises:
    a logic element for switching outputs thereof depending on an externally input logical value.

13. A non-volatile semiconductor memory device according to claim 8, wherein the memory capacity of the memory bank is $\frac{1}{2}^n$ of the capacity of the overall memories where n is a natural number.

14. A non-volatile semiconductor memory device according to claim 8, wherein the non-volatile semiconductor memory device is an electrically writable and erasable flash memory.

15. An information apparatus comprising a non-volatile semiconductor memory device according to claim 1, wherein a memory operation is carried out using the non-volatile semiconductor memory device.

16. A non-volatile semiconductor memory device according to claim 2, wherein the logic inversion section comprises a first inverter connected to a bit line of the most significant bit of the input address signal and a second inverter connected to a bit line of the second most significant bit of the input address signal.

* * * * *